(12) United States Patent
Attarian et al.

(10) Patent No.: US 6,406,328 B1
(45) Date of Patent: Jun. 18, 2002

(54) REMOTE LCD ADAPTER AND METHOD FOR ELECTRONIC CIRCUIT BREAKERS

(75) Inventors: Farshid Attarian, Collinsville; Joseph Criniti, New Britain; Alberto A. Figueroa, Southington; Javier Ignacio Larranaga; Joseph B. Kalaita, both of Bristol, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/566,404

(22) Filed: May 8, 2000

(51) Int. Cl.[7] .............................................. H01R 11/00
(52) U.S. Cl. ...................................... 439/502; 439/638
(58) Field of Search ................................ 439/502, 638; 361/93–97, 350–360, 331, 391, 383, 386; 355/132, 202

(56) References Cited

U.S. PATENT DOCUMENTS

| | | | | |
|---|---|---|---|---|
| 4,476,511 A | * | 10/1984 | Saletta et al. ................. | 361/96 |
| 4,814,712 A | * | 3/1989 | Burton et al. ................ | 324/424 |
| 4,870,531 A | * | 9/1989 | Danek ......................... | 361/93 |
| 5,151,842 A | * | 9/1992 | DeBiasi et al. .............. | 361/93 |
| 5,204,798 A | * | 4/1993 | Scott ........................... | 361/93 |
| 5,288,958 A | | 2/1994 | Grunert et al. | |
| 5,299,944 A | * | 4/1994 | Larabell et al. ............. | 439/157 |
| 5,544,959 A | * | 8/1996 | Collin et al. ................ | 335/202 |
| 5,587,570 A | | 12/1996 | Kalaita et al. | |
| 5,833,842 A | * | 11/1998 | Fields .......................... | 210/85 |
| 6,169,651 B1 | | 1/2001 | Dias ............................ | 361/206 |

OTHER PUBLICATIONS

General Electric Co. Publication GEH–6441, MicroVersa-Trip Plus and MicroVersa Trip PM Remote Display, Feb. 1995, pp. 1–7.

* cited by examiner

Primary Examiner—Brian Sircus
Assistant Examiner—Son V. Nguyen
(74) Attorney, Agent, or Firm—Cantor Colburn LLP

(57) ABSTRACT

To allow access to a control/display module in an electronic circuit breaker, an adapter and harness are provided for remotely positioning the control/display module in a more accessible location, e.g., on the remote handle operator. An adapter plug and plate installs in place of the control/display module on the circuit breaker. The adapter plug provides connectors for a harness to extend to a mounting plate, which can be attached to the remote handle operator. The control/display module, which was removed from the circuit breaker, is installed in the mounting plate.

9 Claims, 3 Drawing Sheets

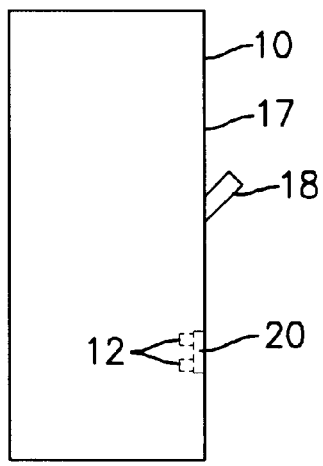
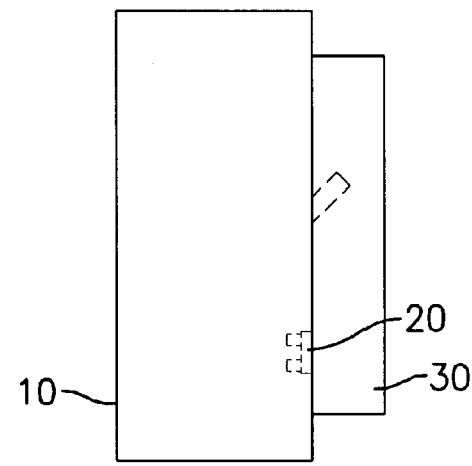
FIG. 1
(PRIOR ART)
FIG. 2
(PRIOR ART)
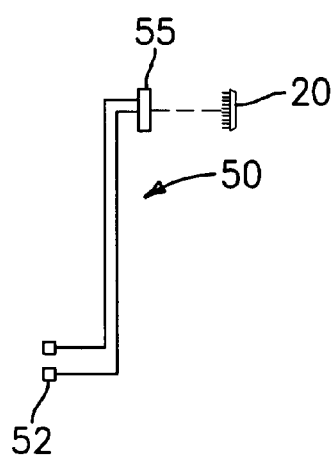
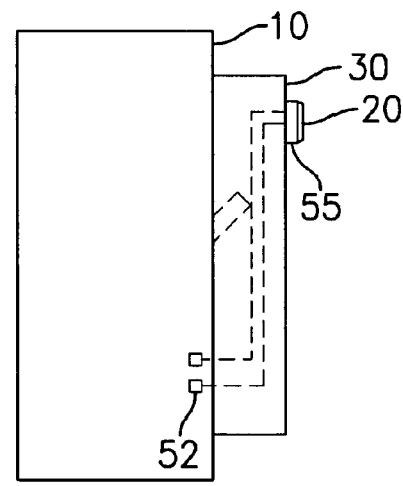
FIG. 3
FIG. 4

REMOTE LCD ADAPTER AND METHOD FOR ELECTRONIC CIRCUIT BREAKERS

BACKGROUND OF THE INVENTION

Electronic circuit breakers provide over-current protection to electrical distribution circuits and various loads. Electronic circuit breakers employ micro-electronics to control the conditions under which the circuit is broken. These devices sometimes include a control/display module, e.g., an LCD and pushbutton programming unit for conveniently adjusting the circuit-breaker's settings. However, access to the control/display module can be prevented when a remote handle operator is installed on the breaker unit. Remote handle operators are commonly mounted on top of the breaker handle and provide the motion to remotely operate the circuit breaker. This has been a major drawback in the use of remote handle operators.

BRIEF SUMMARY OF THE INVENTION

To solve the problem noted above, the present inventor provides an adapter and harness for remotely positioning the control/display module in a more accessible location, e.g., on the remote handle operator. The inventor provides an adapter plug and plate that installs in place of the control/display module unit on the circuit breaker. The adapter plug provides connectors for a harness to extend to a mounting plate, which can be attached to the remote handle operator. The control/display module, which was removed from the circuit breaker, is then installed in the mounting plate.

These and other features of the invention will be more clearly described in the detailed description below.

BRIEF DESCRIPTION OF THE DRAWINGS

FIG. 1 shows a profile view of a circuit breaker of the prior art;

FIG. 2 shows a profile view of a circuit breaker fitted with a remote handle operator according to the prior art;

FIG. 3 shows a schematic representation of the control/display adapter in accordance with a preferred embodiment of the present invention;

FIG. 4 shows the circuit breaker and remote handle operator of FIG. 2, but with the adapter of FIG. 3 installed;

DETAILED DESCRIPTION OF THE INVENTION

Figure 5:
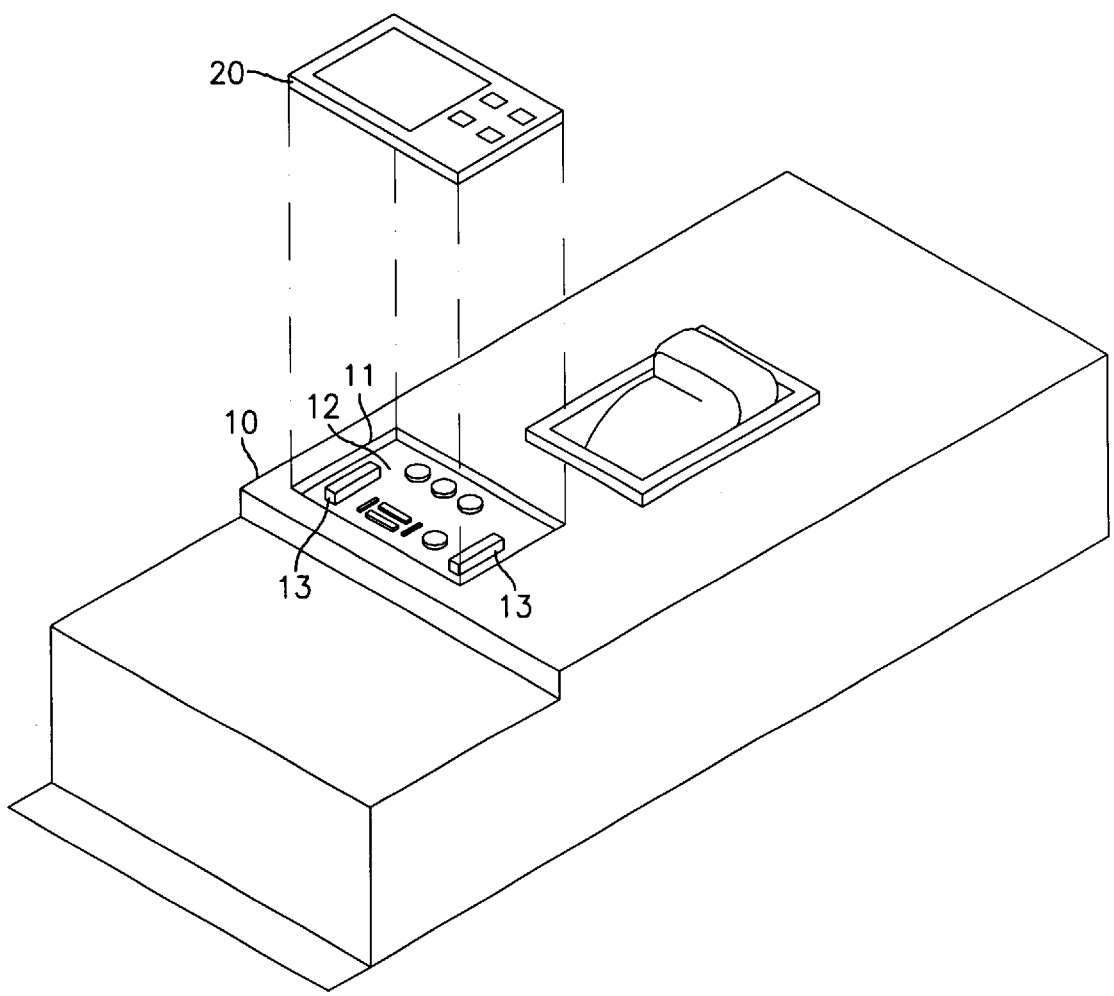
FIG. 5 shows a perspective view of the prior art electronic circuit breaker showing a control/display module separated from its position on the breaker unit.

Prior art FIG. 1 shows a profile view of a circuit breaker unit 10 having switch handle 18. Control/display module 20, which is typically mounted flush with face 17 of breaker unit 10, is hidden or partially hidden by remote handle operator 30 when it is installed on breaker unit 10 as shown in prior art FIG. 2.

FIGS. 3 and 4 show adapter unit 50 of a preferred embodiment of the present invention. Connectors 52 of adapter unit 50 connect electrically to connectors 13, shown in FIG. 5, of breaker unit 10. Mounting plate 55 is attached to a convenient location, such as the housing of remote handle operator 30. Finally, control/display module 20, which has been removed from breaker unit 10, is installed on mounting plate 55.

Figure 6:
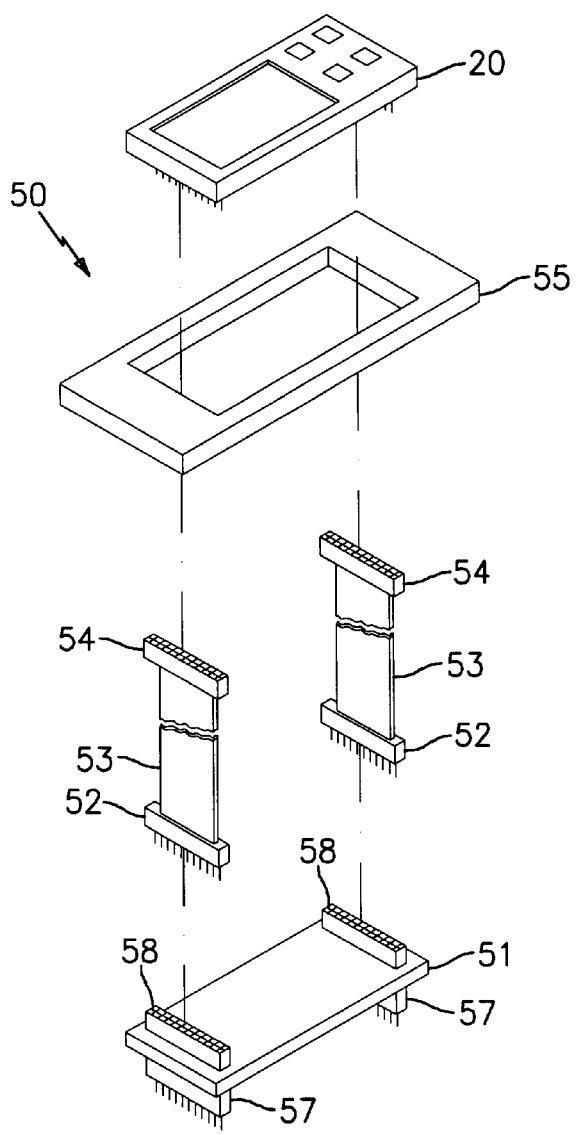
FIG. 6 shows a perspective view of a first embodiment of the invention.
Figure 7:
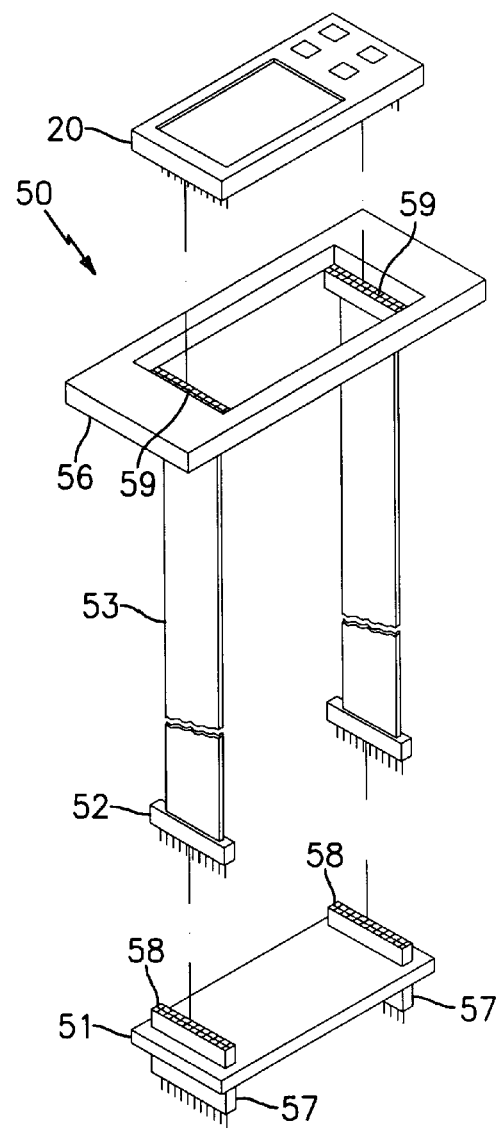
FIG. 7 shows a perspective view of a second embodiment of he invention.

Referring to FIGS. 1 and 5, a prior art electronic circuit breaker 10 is shown. Control/display module 20 is typically mounted flush with the face of circuit breaker 10 in aperture 11 when plugged into connectors 13. When control/display module 20 is removed, circuit components of trip unit 12 are exposed. To protect internal components and trip unit 12 from foreign matter after control/display module 20 is removed, the adapter unit provides a jumper plug 51 as shown in FIGS. 6 and 7. Jumper plug 51 takes the place of control/display module 20 in breaker unit 10. The jumper board is electrically connected to the trip unit, and may be secured or attached to the molded case of breaker unit 10 by screws. Jumper plug 51 provides adapter connectors 58, which are accessible from outside breaker unit 10 after jumper plug 51 is installed. Connectors 58 are electrically connected to connectors 13 in trip unit 12 via second jumper plug connectors 57. Additionally, the jumper plug 51 is a cover because, when installed, the jumper plug 51 covers the hole in the circuit breaker 10 that is created when the control module 20 is removed.

FIGS. 6 and 7 show two embodiments comprising slightly different mounting strategies for control/display module 20. In FIG. 6, ribbon cables 53 connect jumper plug 51 directly to control/display module 20 using plugs 52 and 54. Control/display module 20 is mechanically mounted to mounting plate 55 which can be attached in a convenient location, e.g. on the housing of the remote handle operator, using known means. FIG. 7 shows an alternative embodiment where mounting plate 56 supports plugs 59. In this embodiment, plugs 59 both electrically connect control/display module 20 to trip unit 12 and mechanically connects control/display module 20 to mounting plate 56.

The adapter unit of the preferred embodiment allows service personnel to access the control/readout module, even when a remote handle operator is mounted to the circuit breaker housing. With the adapter unit, the control/readout module maintains full functionality, as if it were mounted to the circuit breaker housing.

While the invention has been described with particular reference to the preferred embodiments, it will be understood by those skilled in the art that various changes may be made and equivalents may be substituted for elements of the preferred embodiments without departing from the invention. It is accordingly intended that the claims shall cover all such modifications and applications as do not depart from the true spirit and scope of the invention.

What is claimed is:

1. A remote control/display adapter for an electronic circuit breaker, comprising:

a mounting plate for supporting and retaining a control/display module;

a first connector for connecting to a trip unit;

a second connector for connecting to said control/display module;

a cable electrically connecting said first connector to said second connector; and a jumper plug interposed between said trip unit and said first connector for covering a hole in the electronic circuit breaker that is created when the control display module is removed.

2. The remote control/display adapter of claim 1, wherein;

said second connector is supported by said mounting plate and wherein sad second connector electrically connects said control/display module to said trip unit and mechanically connects said control/display module to said mounting plate.

3. A method of attaching a remote control/display module to an electronic circuit breaker, comprising:

removing the control/display module from the electronic circuit breaker by unplugging the control/display module from a trip unit in the electronic circuit breaker and separating the control/display module from the electronic circuit breaker;

electrically connecting a jumper plug to the trip unit;

electrically connecting a first plug of a cable to the jumper plug;

electrically connecting a second plug of the cable to the control/display module; and mounting the control/display module in a convenient location remote from the electronic circuit breaker.

4. The method of claim 3, wherein;

said electrically connecting a second plug of the cable includes attaching the control/display module to a mounting plate having said second plug of the cable, and said mounting the control/display module includes attaching the mounting plate to said convenient location.

5. The method of claim 3, wherein;

said mounting the control/display module includes attaching the control/display module to a mounting plate and attaching the mounting plate to said convenient location.

6. An electronic circuit breaker comprising:

a manually operable handle for manually opening an electrical connection in the electronic circuit breaker and for manually resetting the electronic circuit breaker when tripped;

a remote handle operator attached to said electronic circuit breaker for remotely operating said manually operable handle, said remote handle operator hiding a portion of an opening in said circuit breaker wherein said opening is adapted for the installation of a control/display module;

a control/display module electrically connected to said circuit breaker and attached at a location remote from said circuit breaker;

a jumper plug attached to electrical connectors in said circuit breaker in place of the control/display module, said jumper plug covering said opening created when said control/display module is relocated to said remote location; and a cable extending from said jumper plug to the remote location.

7. The electronic circuit breaker of claim 6 wherein said control/display module is attached to a front face of the remote handle operator.

8. The electronic circuit breaker of claim 6 further comprising:

a mounting plate attached at the remote location for supporting the control/display module at the remote location.

9. The electronic circuit breaker of claim 8 wherein;

said mounting plate includes electrical connectors having a configuration substantially identical to electrical connections in said circuit breaker, said electrical connectors of said mounting plate mechanically connecting the control/display module to the mounting plate and electrically connecting the control/display module to the electronic circuit breaker.

* * * * *